United States Patent
Wambach

[11] Patent Number: 6,075,201
[45] Date of Patent: Jun. 13, 2000

[54] PHOTOVOLTAIC SOLAR MODULE IN PLATE FORM

[75] Inventor: Karsten Wambach, Ratingen, Germany

[73] Assignee: Pilkington Solar International GmbH, Köln, Germany

[21] Appl. No.: 09/048,189

[22] Filed: Mar. 25, 1998

[30] Foreign Application Priority Data

Mar. 26, 1997 [DE] Germany .............................. 197 12 747

[51] Int. Cl.[7] ................................................. H01L 31/048
[52] U.S. Cl. ........................... 136/251; 136/256; 136/259; 136/244; 52/173.3; 126/569; 126/621; 257/433; 257/434
[58] Field of Search ...................................... 136/251, 256, 136/259, 244; 52/173.3; 126/569, 621; 257/433, 434

[56] References Cited

U.S. PATENT DOCUMENTS 4,097,308   6/1978   Klein et al. ............................... 136/251

FOREIGN PATENT DOCUMENTS

| | | |
|---|---|---|
| 490723 | 6/1992 | European Pat. Off. . |
| 619691 | 10/1994 | European Pat. Off. . |
| 746044 | 12/1996 | European Pat. Off. . |
| 867946 | 9/1998 | European Pat. Off. . |
| 4140682 | 6/1993 | Germany . |
| 4206365 | 8/1993 | Germany . |
| 296 05 510 U1 | 5/1996 | Germany . |
| WO 93/12636 | 6/1993 | WIPO . |

*Primary Examiner*—Alan Diamond
*Attorney, Agent, or Firm*—Marshall & Melhorn

[57] ABSTRACT

A photovoltaic solar module in plate form, in particular for use as a curtain wall or roof element, with at least one outer pane facing towards the incident light, at least one inner cover arranged at a distance behind it in the direction of the incident light, and, if necessary, an edge structure surrounding the outer pane and the inner cover, joining them to one another to form a seal. Solar cells are arranged between the outer pane and the inner cover, embedded in cast resin, laminating film(s) or the like, with a system of conductors interconnecting them electrically, from which connecting leads for electrical connection to other adjacent solar modules lead into the area located outside the plate structure. The connecting leads are attached to a connecting lug, which is joined to a module connection element extending essentially outside the plate structure, where the connecting lug is arranged on a tangential plane of the module connection element and can be interconnected to corresponding module connection elements of adjacent solar modules. The electrical connection system possesses a high degree of mechanical stability, even if individual components possess little or no load-bearing capability, e.g. an inner cover of a flexible plastic film.

25 Claims, 3 Drawing Sheets

PHOTOVOLTAIC SOLAR MODULE IN PLATE FORM

BACKGROUND OF THE INVENTION

The invention concerns a photovoltaic solar module in plate form, in particular for use as curtain wall or roof element, with at least one outer pane facing towards the incident light, at least one inner cover arranged at a distance behind it in the direction of the incident light, thus producing an interspace, and, if necessary, an edge structure surrounding the outer pane and the inner cover, joining them to one another to form a seal and with solar cells arranged between the outer pane and the inner cover, embedded in cast resin, laminating film(s) or the like, with a system of conductors interconnecting them electrically, from which connecting leads for electrical connection to other adjacent solar modules lead into the area located outside the plate structure.

Solar modules of this type are generally assembled by mechanical and electrical connection with solar curtain wall surfaces or solar roof cladding slabs. In such cases, the electrical bearing surfaces are joined to one another by means of suitable electrical connectors; mechanical joining of adjacent solar modules is to be carried out separately therefrom.

In the case of the solar modules described in DE 41 40 682 Al, an electrical contact pin system is provided in a frame surrounding the plate structure, where the frame is to be brought into engagement with a frame of an adjacent solar module which is of complementary design, in both electrical and mechanical respects.

WO 93/12636 takes into account the requirements of solar module plate structures in the field of shipbuilding and proposes using a connection housing to shield the connection of an electric cable to the connecting leads of a solar module close to one edge area of the plate structure, where the cable connections are encapsulated with epoxy resin for example in order to keep moisture away from the critical areas of the electrical system.

In the case of other types of laminated glass panes, it has been found useful to lead the connecting leads of heating wires, for example, to a connecting lug, which is rolled up to form a cable connection sleeves, into which the cables are soldered. Such an arrangement is disclosed, for example, in DE 90 16 664 Ul or in EP 0 619 691 A1. A similar arrangement, where heating conductors are lead out at various sleeves with connecting lug, is described in DE 42 06 365 C1.

Basically, such a method of leading out the electrical connecting leads via a connecting lugs would be a cost-effective alternative to the solution proposed in DE 41 40 682 Al. Of course, it would have to be taken into account that the electrical interconnection of the various solar modules will be carried out by an electrical technician, as clear assignment of the electrical connecting leads hanging down loose, which requires more complex connection than, for example, is the case with a heated pane, cannot be entrusted to the construction personnel generally concerned with the installation of photovoltaic solar cladding slabs. In this connection, DE 296 05 510 Ul proposes a photovoltaic solar module whose connection system incorporates a sleeve with plug-and-socket system for interconnection of adjacent modules, where electrical contact is established by means of a connecting lug projecting into the interspace, which is arranged along the plane of symmetry of the sleeve. The sleeve can rest on both panes of the plate structure.

This known arrangement is in need of improvement for special solar module designs if, for example, one of the components forming the plate structure, generally the rear inner cover, takes the form of a component which possesses little or no mechanical load-bearing capability, such as for example a flexible film or a thin glass plate.

Thin glass plate means here glass plates having a thickness of 3 mm at maximum.

SUMMARY OF THE INVENTION

It is the purpose of the invention to provide a solar module of the type stated, whose electrical connection system possesses a high degree of mechanical stability, even if individual components possess little or no load-bearing capability. Thus, according to the invention, provision is made for the connecting leads to be attached to a connecting lug, which is joined to module connection element which extends essentially outside the plate structure, where the connecting lug is arranged on a tangential plane of the module connection element, and where the module connection element can be interconnected to corresponding module connection elements of adjacent solar modules.

"Arranged on a tangential plane of the module connection element" means here, for the connecting lug, that it is led tangentially to an imaginary circle circumscribing the cross-section of the module connection element and terminates at a peripheral point of the module connection element—as is the case anyway with a circular cross-section of the module connection element, but is also conceivable for example in the case of a more polygonal cross-section of the module connection element—without it being placed tangentially on or in a lateral surface of the module connection element, as is appropriate, for example, in the case of a module connection element of square cross-section.

With the invention, a connection system is created which can be attached mechanically to the solar module plate structure in an especially simple, but nevertheless stable manner. The universal module connection element, which can comprise plug connectors, sockets, sleeves and the like, can, with one and the same configuration be arranged at the module edge, as well as at the outer surfaces of the plate structure, and can be bonded to it.

Preferred embodiments of the invention incorporate as inner cover a flexible film, which is, for example, made of plastic, preferably of polyvinylidene fluoride, or a flexible film laminate. The film laminate can be a sandwich structure with a base film laminated on at least one side, but generally on both sides, this base film consisting for example of a plastic film, such as polyester, or a metal, such as aluminium. The laminate can be a fluoropolymer.

In order to improve mechanical stability, a bracing plate can be attached to the film, at least in the region of the connecting lug.

In order at the same time to protect the module connection element, provision can be made for the bracing plate to incorporate a ridge projecting above the edge region of the plate structure.

The inner cover can be an inherently rigid plate or pane, such as for example a glass pane or a plastic sheet which is inflexible under mechanical loads which are not excessive; the invention develops special advantages however if the inner cover is a flexible plastic film, a film laminate or a thin glass plate, with which electrical connection is more susceptible to mechanical failure than is the case with an inherently rigid plate or pane. In this respect, "thin" means a thickness of not more than 3 mm for a glass plate.

It is advantageous for a transitional surface from the cylindrical module connection element to the connecting lug to be designed such that this transitional surface runs perpendicular to the connecting lug on another tangential plane of the module connection element and forms an additional stabilizing surface of the module connection element.

Provision can be made for the connecting lug to project at least partly into the interspace.

The module connection element can be arranged on the edge of the plate structure.

In a first variant, the module connection element can rest on the peripheral edge either of the outer pane or of the inner cover, preferably, the rest is at least section-wise inwardly offset with respect to that of the opposite outer pane or that of the inner cover. Thereby, the module connection element can be arranged at the rim of the solar module in a very space-saving manner, protruding thereof is avoided. In a second variant, it can seat on a side of the outer pane or of the inner cover facing the interspace. Combinations of these variants are also conceivable.

According to a further embodiment of the invention, the connecting lug and the module connection element can be attached to a side of the outer pane or of the inner cover facing away from the interspace, where the connecting lug is arranged partly over at least one through opening in the outer pane or inner cover, through which the connecting leads are to be led outer of the interspace.

In this case, at least the area of the outer pane or of the inner cover can be provided with a protective cap over the through opening(s).

The space between the protective cap and the outer pane or the inner cover can usefully be filled with a sealing compound, for example silicone.

The module connection element and/or the connecting lug can advantageously be bonded to the outer pane or the inner cover. High-strength adhesives for this purpose are known.

Mechanical location is further improved if a fixing element at least partly overlapping the module connection element is provided, which is attached to the protective cap or to the bracing plate.

Finally, the module connection element can possess an essentially circular or polygonal cross section.

DESCRIPTION OF THE DRAWINGS

The invention will be explained in detail below with the aid of the enclosed drawings. It shows the following.

DETAILED DESCRIPTION OF THE PREFERRED EMBODIMENTS

Figure 1:
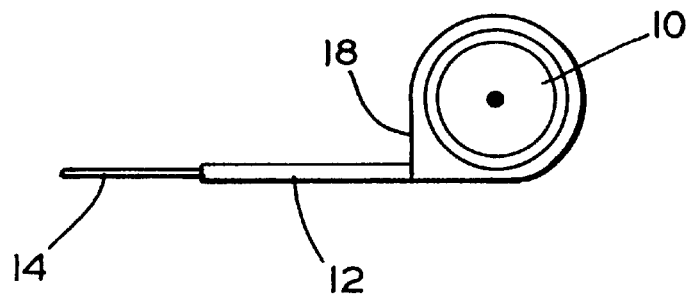
FIG. 1 is an embodiment of a universal module connection element with connecting lug in cross-section.

With reference now more specifically to the drawings, FIG. 1 shows a universal module connection element 10 which comprises an essentially cylindrical basic unit into which leads tangentially a connecting lug 12, at whose distal end electrical connections 14 are provided. Perpendicular to the connecting lug 12 is provided a bearing surface 18, which also leads tangentially into the outer surface of the module connection element 10.

Figure 2:
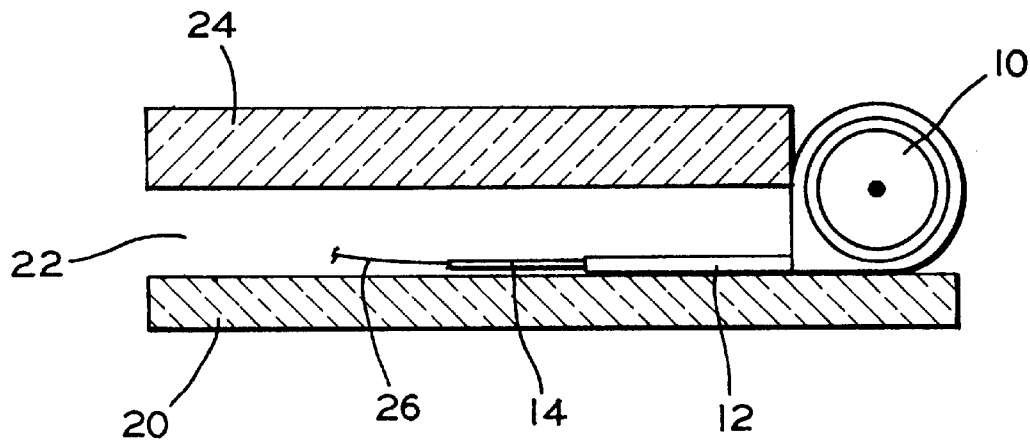
FIG. 2 is a cross-sectional view of a solar module plate structure with module connection element.

FIG. 2 shows an example of a solar module plate structure which consists of a transparent outer pane 20 which faces towards the light incidence side. The outer pane 20 can consist of plastic or glass, preferably of a high-transparency soda-lime-silicate glass, such as white glass. At a distance from the outer pane 20, is arranged an inner cover 24, in this case an inherently rigid plate, for example a glass pane, where the outer pane 20 and the plate 24 define an interspace 22, in which the solar cells are located, for example embedded in a plastic layer of polyvinylbutyral (PVB) or ethylene/vinyl acetate (EVA). The solar cells have been omitted from the drawing; the reference number 26 indicates only the electric leads leading from them, which are to be connected with connections 14. In the case of the embodiment illustrated in FIG. 2, the connecting lug 12 projects into the interspace 22, while the module connection element 10 is seated on the side of the outer pane facing towards the interspace 22 and extends inside a step which is formed by the receding edge of the plate 24. As the connecting lug 12 merges tangentially into the peripheral surface of the module connection element 10, it is possible by means of suitable adhesive securing to produce a rigid mechanical grip between connecting lug 12 or module connection element 10 and outer pane 20.

Figure 3:
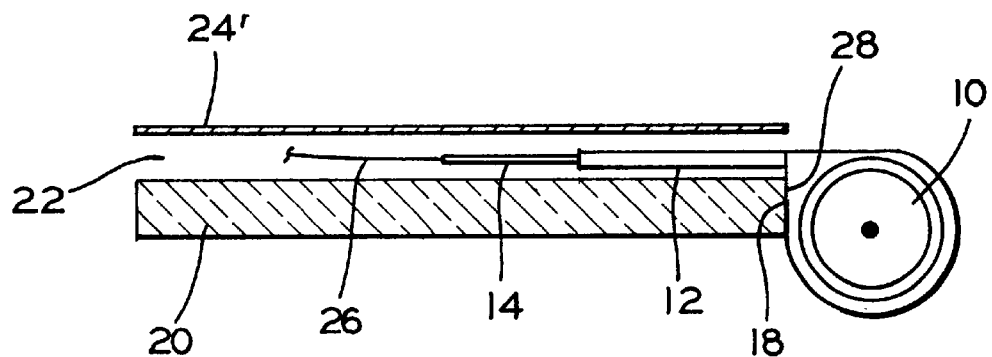
FIG. 3 is another solar module plate structure with module connection element.

In the case of the embodiment illustrated in FIG. 3, the interspace 22 is formed between an outer pane 20 and a film 24'. As the film 24' can only be subjected to slight mechanical load, the module connection element 10 is arranged such that its bearing surface 18 seats on the peripheral edge 28 of the outer pane 20.

Figure 4:
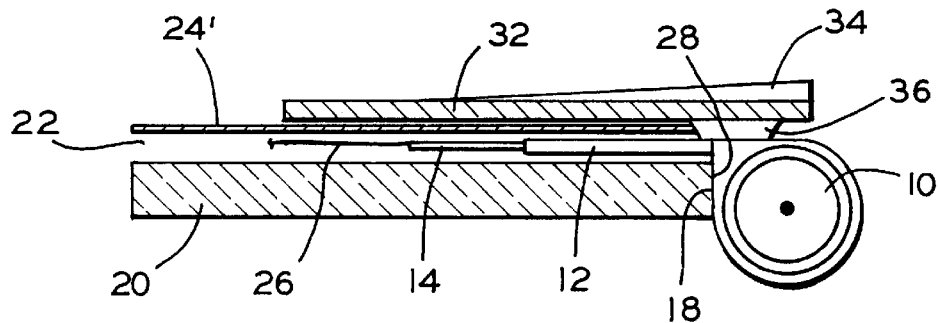
FIG. 4 is a solar module plate structure with a film as inner cover, where the module connection element rests on the peripheral edge of the outer pane.

In order to improve the stability of the arrangement still further, as illustrated in FIG. 4, the area of the film 24' which lies above the connecting leads 14 or the connecting lug 12 is covered with a reinforcing plate 32. In the case of the present embodiment, this reinforcing plate 32 possesses a ridge 34 extending it, which extends at least partially over the module connection element 10 and is fixed to it by bonding, for example with a high-strength adhesive or an adhesive strip 36.

In place of the film 24', it is also possible to provide a film laminate. This consists for example of an approximately 400 $\mu$m thick polyester film or aluminium foil which is laminated on both sides with a fluoropolymer which is in each case approximately 20 $\mu$m thick.

Another preferred film laminate consists of 37 $\mu$m thick polyvinylidene fluoride (PVF) film, 75 $\mu$m thick polyethylene terephthalate (PETP) film and 37 $\mu$m thick polyvinylidene fluoride (PVF) film. Also preferred is a laminate consisting of 37 $\mu$m polyvinylidene fluoride (PVF) film, 50 $\mu$m thick polyethylene terephthalate (PETP) film, 30 $\mu$m aluminum (Al) foil, and 37 $\mu$m thick polyvinyl fluoride (PVF) foil.

Figure 5:
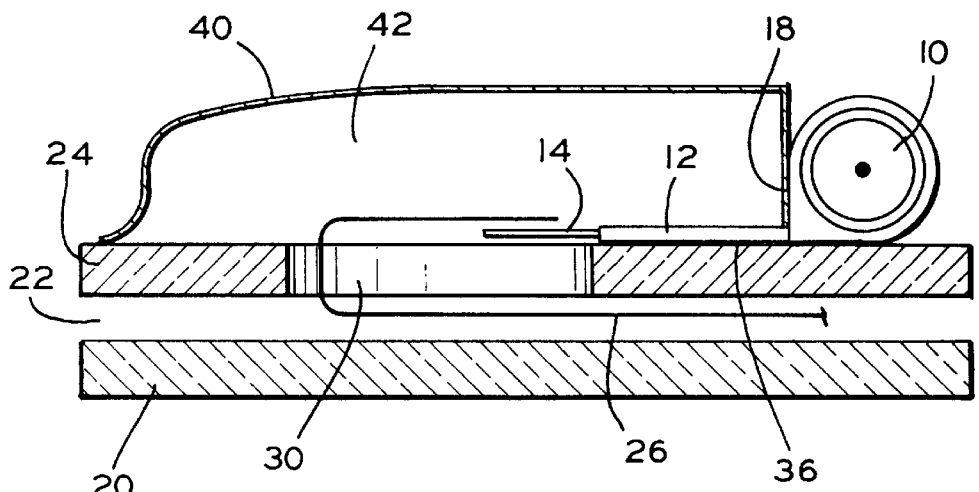
FIG. 5 is a fourth embodiment of a solar module plate structure with module connection element mounted on the back of the module.

FIG. 5 shows an embodiment of a solar module, where a through opening 30 is provided in the plate 24 opposite the outer pane 20. Through this through opening 30 are laid the connecting leads 26 which lead from the solar cells. The module connection element 10 with its connecting lug 12 is bonded onto the side of the plate 24 facing away from the light incidence side, again for example with a high-strength adhesive or adhesive strip 36, where the connections 14 locate such that electrical connection with the connecting leads 26 is possible. The through opening 30 and thus also the connections between the connecting leads 26 and the connections 14 are covered with a protective cap 40, whose side facing towards the module connection element 10 is designed such that it is adapted at least to the bearing surface 18 of the module connection element 10. The space 42 underneath the protective cap 40 is filled with sealing compound, for example silicone.

Figure 6:
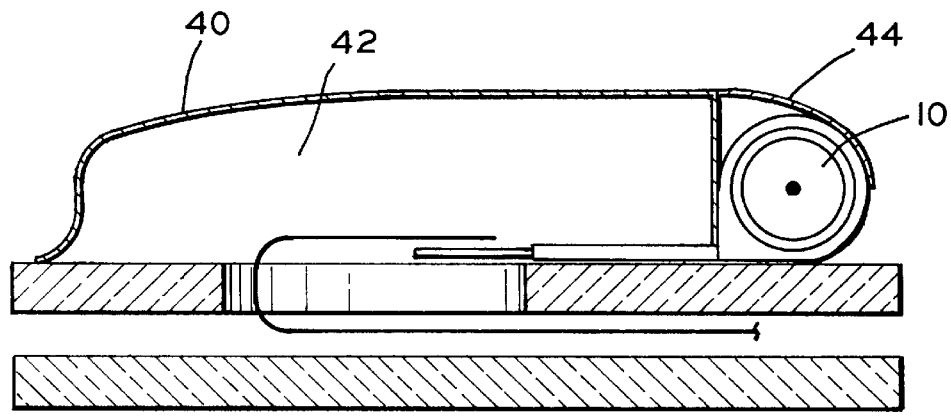
FIG. 6 is a modification of the embodiment in FIG. 5, where a clip overlapping the module connection element is provided.

The embodiment of the solar module illustrated in FIG. 6 differs from that in FIG. 5 in that a clip 44 fixed under the protective cap 40 is provided, this clip engaging at least partially over the module connection element 10.

Figure 7:
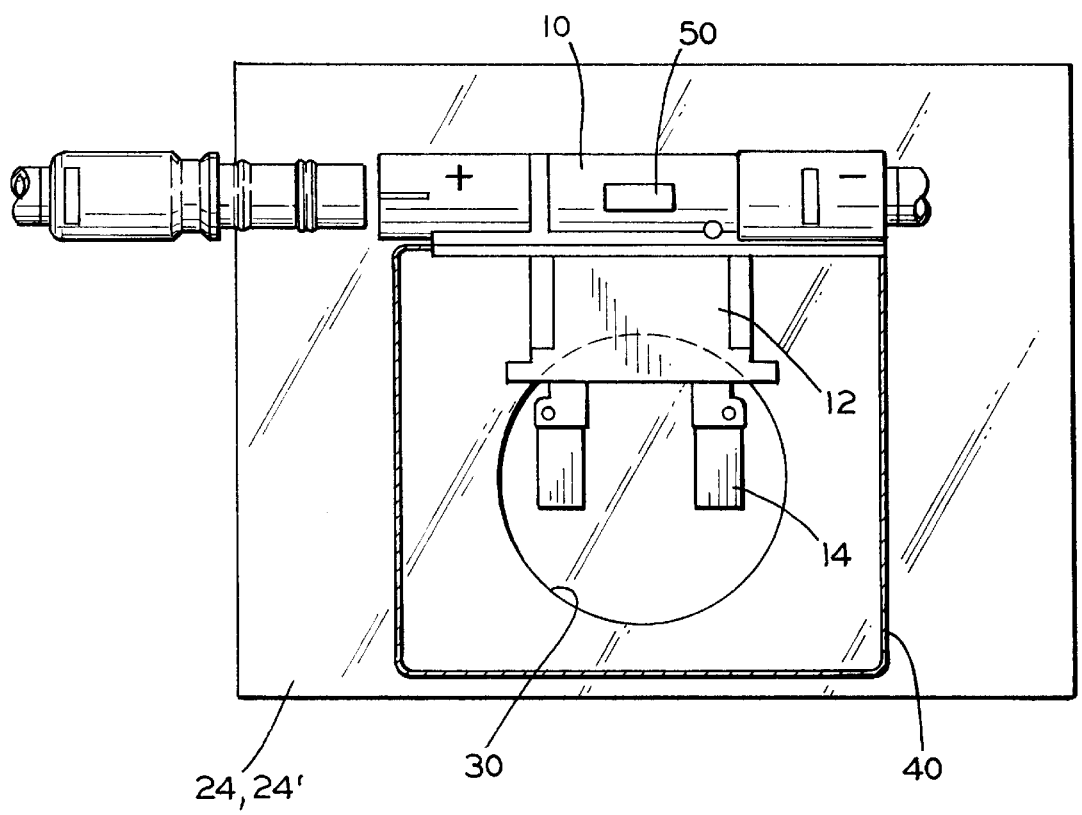
FIG. 7 is a plan view of a plate structure in the area of the electrical connection system, similar to the embodiment according to FIG. 5.

FIG. 7 shows a plan view of the area of the electrical connections of a solar module similar to that illustrated in FIG. 4. The module connection element 10 is arranged at the rear in the edge area of the plate structure on the inner cover 24,24' and contains a diode 50 which short-circuits the connecting leads and thus forms a bypass in the event of an electrical defect within the module. In the inner cover 24,24' is provided a through opening, through which the connecting lug 12 or at least its connections 14 locate. The area of the through opening 30 is covered by a protective cap 40.

The through opening 30 can be drilled in the glass sheet; when using films, it can be punched or cut. Particularly in the case of films, it can take the form of a slit, through which the connecting leads are passed.

The features of the invention disclosed in the specification, in the drawings and in the claims can be essential for implementation of the invention, both individually and in any combination.

What is claimed is:

1. A photovoltaic solar module in plate form with at least one outer pane facing towards the incident light, at least one inner cover arranged at a distance behind it in the direction of the incident light, thus producing an interspace, with solar cells arranged between the outer pane and the inner cover, with a system of conductors interconnecting the solar cells electrically, from which connecting leads for electrical connection to other adjacent solar modules lead into the area located outside the plate structure, wherein the connecting leads are attached to a connecting lug which is joined to a module connection element extending essentially outside the plate structure, wherein the connecting lug is arranged on a tangential plane of the module connection element, which connection element has a planar surface on its periphery forming one plane with said tangential connecting lug, and where the module connection element is adapted to be interconnected to corresponding module connection elements of adjacent solar modules.

2. A solar module in accordance with claim 1, wherein the solar cells are embedded by a laminating film.

3. A solar module in accordance with claim 1, wherein the inner cover is a flexible film or flexible film laminate.

4. A solar module in accordance with claim 3, wherein to the film or the film laminate is attached a bracing plate at least in the region of the connecting lug.

5. A solar module in accordance with claim 4, wherein at least the area of the outer pane or of the inner cover is provided with a protective cap, and a fastening clip at least partially overlapping the module connection element is provided, said fastening clip being attached to the protective cap or the bracing plate.

6. A solar module in accordance with claim 2, wherein the film laminate is a sandwich structure with a base film laminated on at least one side, the base film being formed of plastic or metal.

7. A solar module in accordance with claim 6, wherein the base film is laminated with a fluoropolymer.

8. A solar module in accordance with claim 4, wherein the bracing plate incorporates a ridge projecting over the edge area of the plate structure.

9. A solar module in accordance with claim 1, wherein the inner cover is an inherently rigid plate or pane.

10. A solar module in accordance with claim 1, wherein said inner cover is a glass pane having a maximum thickness of 3 mm.

11. A solar module in accordance with claim 1, wherein the connecting lug projects at least partly into the interspace.

12. A solar module in accordance with claim 1, wherein the module connection element is arranged on the edge of the plate structure.

13. A solar module in accordance with claim 1, wherein the module connection element rests on the peripheral edge either of the outer pane or of the inner cover.

14. A solar module in accordance with claim 13, wherein the peripheral edge on which said module connection element rests is configured to be offset inwardly at least section-wise with respect to that of the outer pane or that of said inner cover.

15. A solar module in accordance with claim 1, wherein the module connection element rests on a side of the outer pane or of the inner cover facing towards the interspace.

16. A solar module in accordance with claim 15, wherein the connecting lug and the module connection element are fixed on a side of the outer pane or of the inner cover facing away from the interspace, where the connecting lug is arranged at least partly over at least one through opening in the outer pane or the inner cover, through which the connecting leads are led out of the interspace.

17. A solar module in accordance with claim 16, wherein at least the area of the outer pane or of the inner cover is provided with a protective cap over the through opening.

18. A solar module in accordance with claim 17, wherein the space between the protective cap and the outer pane or inner cover is filled with an electrically insulating sealing compound.

19. A solar module in accordance with claim 1, wherein the module connection element and/or the connecting lug is/are bonded to the outer pane and/or the inner cover.

20. A solar module in accordance with claim 1, further comprising an edge structure which surrounds and joins together the outer pane and the inner cover, forming a seal therebetween.

21. A solar module in accordance with claim 1, wherein the solar cells are embedded in cast resin.

22. A solar module in accordance with claim 17, wherein the module connection element is attached to the protective cap.

23. A solar module in accordance with claim 1, wherein the module connection element possesses an essentially circular or polygonal cross-section.

24. A photovoltaic solar module in plate form with at least one outer pane facing towards the incident light, at least one inner cover arranged at a distance behind it in the direction of the incident light, thus producing an interspace, with solar cells arranged between the outer pane and the inner cover, with a system of conductors interconnecting the solar cells electrically, from which connecting leads for electrical connection to other adjacent solar modules lead into the area located outside the plate structure, characterized by the fact that the connecting leads are attached to a connecting lug which is joined to a module connection element extending essentially outside the plate structure, where the connecting lug is arranged on a tangential plane of the module connection element, which connection element has a planar surface on its periphery forming one plane with said tangential connecting lug and another planar surface on the periphery oriented perpendicularly to the tangential connecting lug, and where the module connection element is adapted for being electrically interconnected to corresponding module connection elements of adjacent solar modules.

25. A photovoltaic solar module in plate form according to claim 24, wherein the module connection element is adapted to be interconnected to corresponding module connection elements of adjacent solar modules.

* * * * *